United States Patent
Chan et al.

(10) Patent No.: US 7,180,795 B1
(45) Date of Patent: Feb. 20, 2007

(54) METHOD OF SENSING AN EEPROM REFERENCE CELL

(75) Inventors: Johnny Chan, Fremont, CA (US); Jinshu Son, Saratoga, CA (US); Philip S. Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 26 days.

(21) Appl. No.: 11/198,469

(22) Filed: Aug. 5, 2005

(51) Int. Cl.
*G11C 5/14* (2006.01)

(52) U.S. Cl. ............................. 365/189.09; 165/189.04

(58) Field of Classification Search ................ 365/201, 365/189.08, 189.04, 239
See application file for complete search history.

(56) References Cited

U.S. PATENT DOCUMENTS

| | | | |
|---|---|---|---|
| 6,094,368 A | 7/2000 | Ching | 365/49 |
| 6,418,054 B1 * | 7/2002 | Hollmer | 365/185.2 |
| 6,507,517 B2 * | 1/2003 | Rolandi et al. | 365/185.2 |
| 6,584,017 B2 * | 6/2003 | Maayan et al. | 365/185.22 |
| 6,819,589 B1 | 11/2004 | Aakjer | 365/185.02 |
| 7,099,202 B1 * | 8/2006 | Son et al. | 365/189.05 |
| 2002/0015326 A1 * | 2/2002 | Rolandi et al. | 365/185.2 |
| 2004/0218420 A1 | 11/2004 | Aakjer | 365/185.02 |

* cited by examiner

*Primary Examiner*—Anh Phung
*Assistant Examiner*—Hien Nguyen
(74) *Attorney, Agent, or Firm*—Schneck & Schneck; Thomas Schneck

(57) ABSTRACT

An array of memory cells having a predetermined group of storage cells, arranged in a row, also have an arrangement of one or more reference cells fabricated to be adjacent to or proximate to the row of storage cells. The reference cells are written to, erased, or programmed when the storage cells are written to, erased, or programmed. The same number of write, erase, or program cycles and the proximity of the reference cells to the storage cells maintain an operational matching of the storage cells and reference cells.

30 Claims, 4 Drawing Sheets

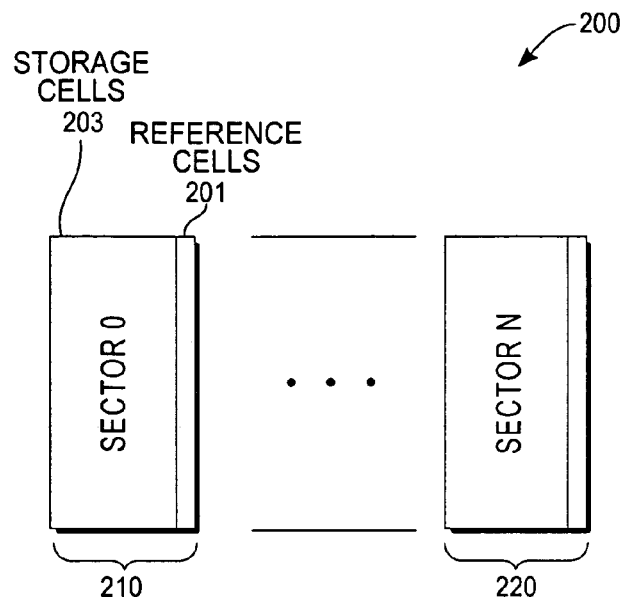
Fig._ 2A
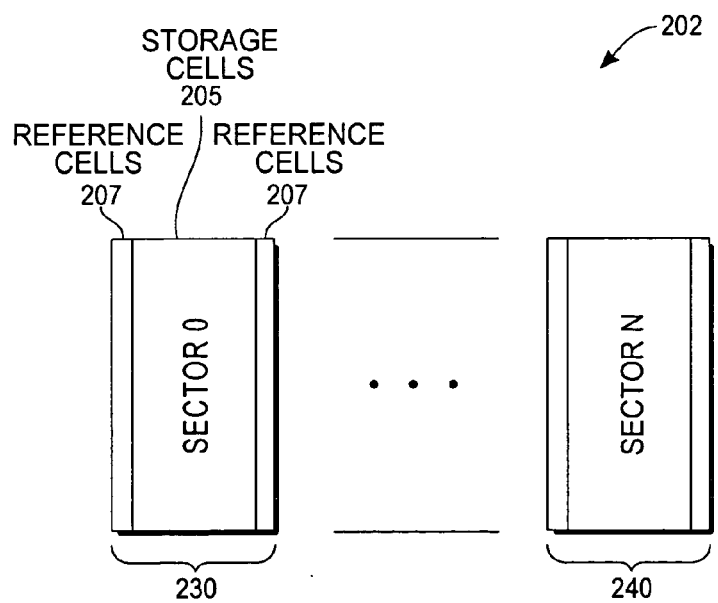
Fig._ 2B

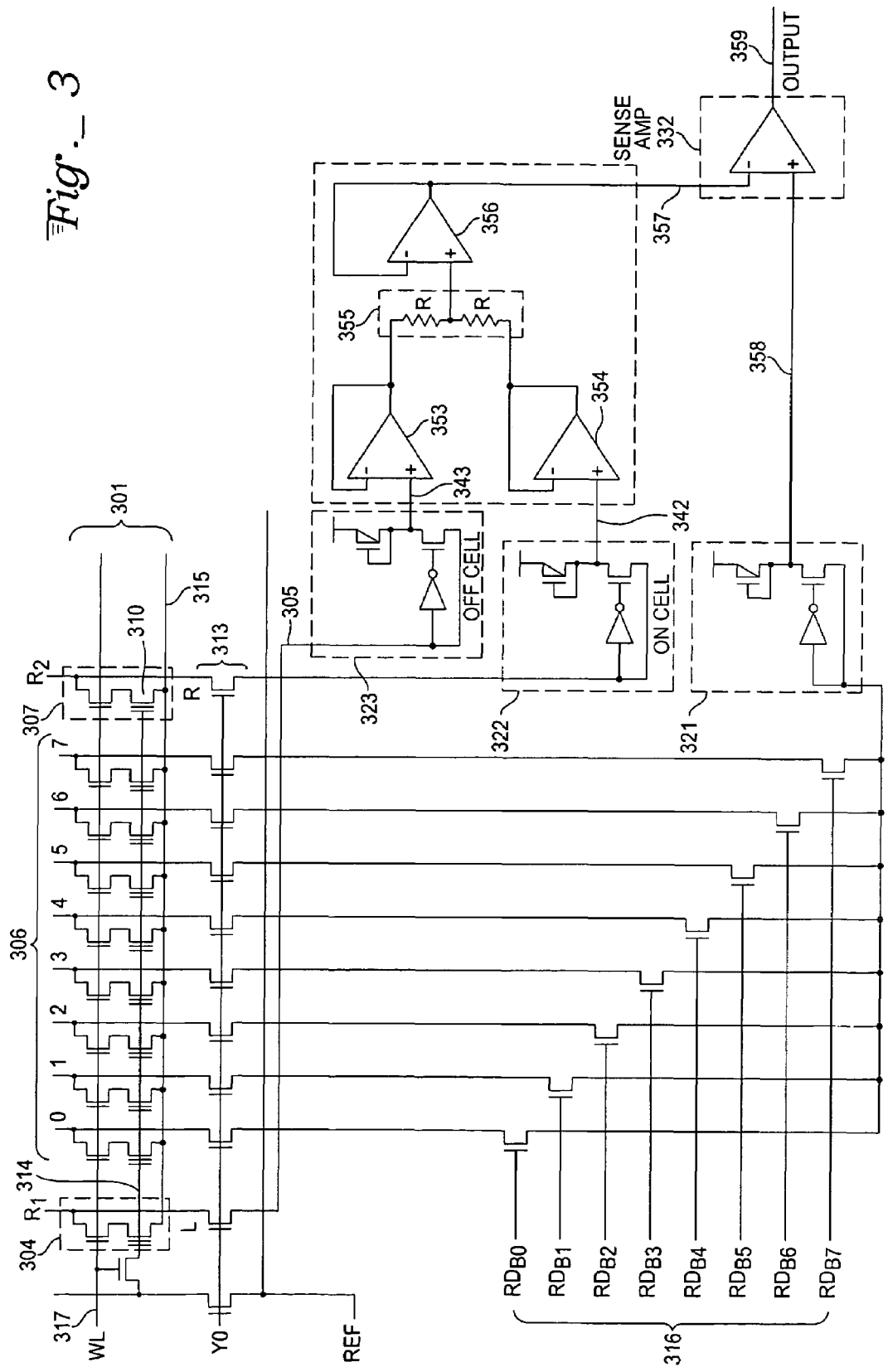
Fig._3

METHOD OF SENSING AN EEPROM REFERENCE CELL

TECHNICAL FIELD

The present invention relates generally to memory devices, in particular, EEPROM and flash memories.

BACKGROUND

Memory such as an EEPROM or a flash memory device contains at least one array of memory cells that include floating gate transistors. The floating gate transistors store data as an electron charge trapped on an isolated floating gate. The amount of trapped charge in a floating gate transistor determines the threshold voltage, and data can be written in or read from a memory cell by setting or programming the threshold voltage of the floating gate transistor in the memory cell. If the methods for setting and determining the threshold voltages are sufficiently accurate and dependable, the memory array will be reliable, and each memory transistor may store multiple bits of data in each memory cell. However, stored data values read from a memory cell may drift from one reading to the next because of variations in the operating parameters of the memory or because of the use and history of the memory.

One difficulty encountered when setting or programming a threshold voltage is variations in operating parameters such as the temperature and supply voltage of the memory. If the operating parameters of the memory during a read operation differ from the operating parameters when the data were written or programmed, the threshold voltage when read from a memory cell can differ from the threshold voltage as written. In addition, charge leakage from the floating gate, memory cell disturb and endurance history, degradation, or the number of write and erase cycles for an individual memory cell in comparison to other memory cells in the array, may affect the characteristics of a memory cell and can change the threshold voltage. Also, due to variances in manufacturing processes, including the location of a memory array on a manufacturing wafer, variations in the structure of each memory cell, or the location of a memory cell within the array, one memory cell may have different characteristics in comparison to another memory cell. Accordingly, to maintain reliability of a memory device, or to support a multi-bit-per-cell memory, variations in operating parameters must be considered to avoid data errors in a memory array or memory device.

Referring to FIG. 1, a typical prior art memory arrangement 100 contains a memory bank or memory array 110. The memory array is further segmented or arranged into one or more individual sectors 116. The memory array 110 contains an array of storage cells 112 (or core array) and an array of reference cells 114 arranged in an array. A single memory device may contain multiple memory banks or memory arrays 110. The array of reference cells 114 is typically arranged or located at the edge or edges of the storage cell array 112. Storage cells 112 and reference cells 114 are accessed or addressed by a row decode circuit 121 and a column decode circuit 123. Generally, the row 121 and column decode 123 circuits activate or access the memory array via word lines and bit lines (not shown) that interconnect storage and reference cells in the memory array. Other control circuits such as a read and sense circuit 131 or a voltage supply circuit (not shown) or ramp circuit (not shown), are used to access, write or program, erase, and read the storage and reference cells.

In the prior art, a selected storage cell in the array of storage cells 112 may be physically apart from the reference cell array 114, as illustrated in FIG. 1. A storage cell and reference cell may have different operating characteristics during a read operation due to any one of the following factors: a) different physical location, b) different structure (due to manufacturing variances), c) different bias voltages on the storage cell sensing gate during a read operation, d) different erase and write or programming environments during a write or programming operation, and e) different number of write cycles or different history thus producing a different degree of degradation to an individual cell. The variance from any one of the above factors may cause the characteristics of a storage cell and a reference cell to drift so a reference cell does not match a storage cell in the core array. Generally, the further a storage cell is from a reference cell, the above factors will vary more and have a greater effect on the operating characteristics of a storage cell and reference cell. In summary, there are multiple variables that may change the operating characteristics of one memory cell in comparison with another memory cell. Differences between a storage cell and a reference cell may cause a stored value in a storage cell to be incorrectly read causing a data error or read failure.

Generally, reference cells are used to maintain a consistent relative measurement standard within a memory device. However, the reference cells may not accurately track other memory cells within the memory device. U.S. Pat. No. 6,094,368 to Ching entitled "Auto-Tracking Write and Read Processes for Multi-Bit-Per-Cell Non-Volatile Memories" has a disadvantage of having reference cells grouped at the edge of a memory cell array, and does not include a method to compensate for the endurance history for the memory cells. U.S. Pat. No. 6,819,589 to Aakjer entitled "Flash Memory With Pre-Detection for Data Loss" implements a second read operation using a second reference or bias voltage to compensate for retention variability in a memory array, but has a disadvantage of negatively affecting the memory's performance when implementing a second or third read operation, and then a refresh operation for memory cells that are weakly programmed. What is needed is a method to compensate or eliminate the variations in operating parameters to provide reliable storage of single bit data or multiple bit data stored in each memory cell within a memory array that does not reduce the overall performance of a memory device.

One approach to account for variations in operating parameters, charge leakage, and degradation is to use a band of threshold voltages that is sufficiently wide to cover the anticipated variations in the threshold voltages read for each data value stored in each memory cell. However, trade-offs must also be considered, for example, to improve programming speed. Also, using a wide range of threshold voltages of a memory cell is limited, since implementing wide bands for each data value reduces the number of bits that can be stored in each memory cell. Accordingly, a reliable memory cell or a multi-bit memory cell is sought that accurately accounts for or compensates for variations in operating parameters and provides a reliable operation or provides a maximum number of data bits per memory cell.

SUMMARY

An array of memory cells contain an array of storage cells and reference cells. A group of storage cells are arranged in a row and at least one reference cell is adjacent to or proximate to the row of storage cells. When the storage cells are written to, erased, or programmed, the reference cells are also written to, erased, or programmed. The same number of write, erase, or program cycles and the proximity of the reference cells to the storage cells maintain an operational matching of the storage cells and reference cells. The proximity and operational cycling of the reference cells and storage cells reduces the variation or drifting of the operational characteristics of the storage cells and associated reference cells to overcome any mismatch between the cells.

BRIEF DESCRIPTION OF THE DRAWINGS

FIGS. 2A and 2B are block diagrams of exemplary storage cell and reference cell arrangements within a memory device.

FIG. 3 is an exemplary circuit diagram of the storage cells and reference cells of FIGS. 2A and 2B.

DETAILED DESCRIPTION

Figure 1:
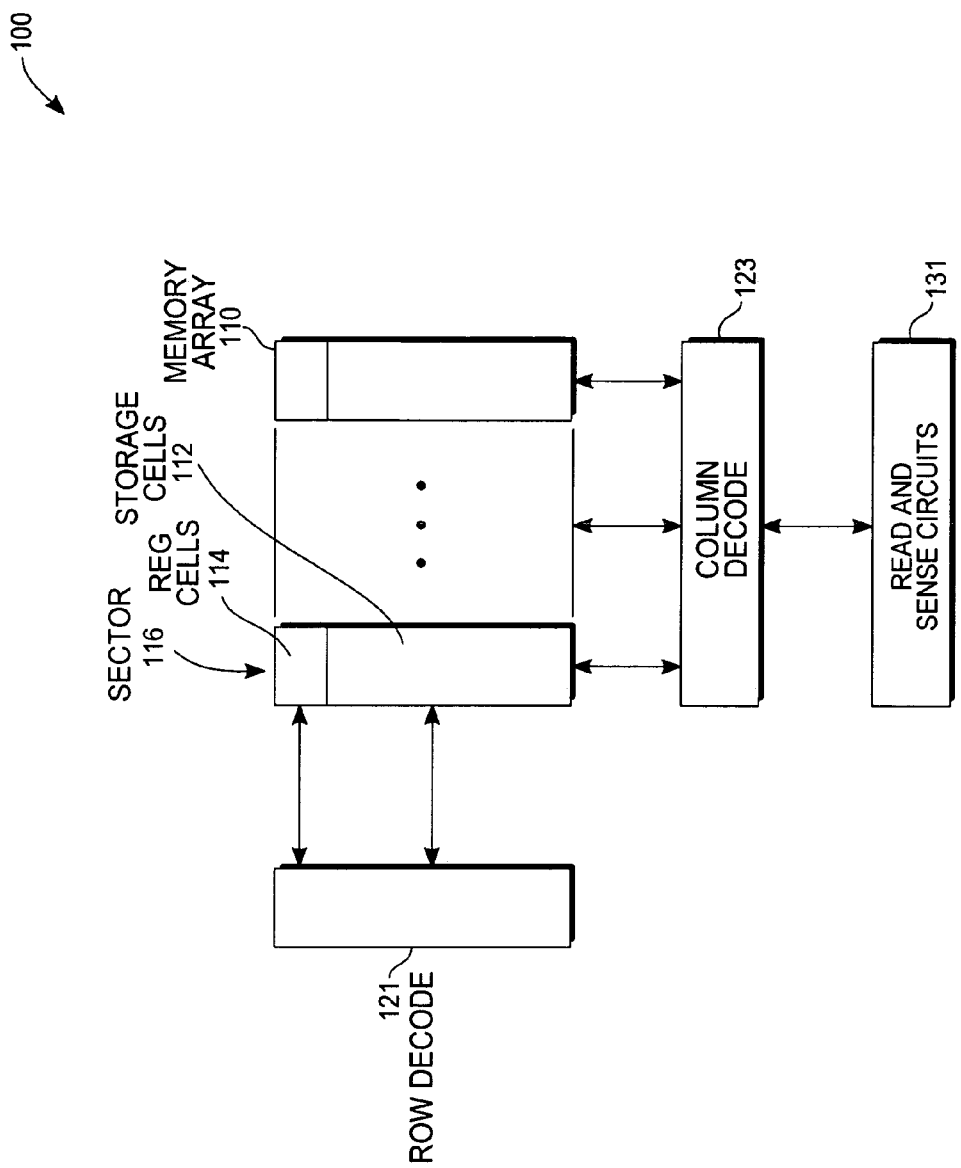
FIG. 1 is a block diagram of a prior art memory architecture.

Storage cells and reference cells each have the same or similar structures, but different functions. Storage cells are programmed and used to store data values, logic values, or bits of data. Storage cells may store a single bit of data, or multiple bits of data. Multiple bits of data may be stored as different voltage levels. Reference cells may also be programmed, but are used to store reference values that are compared to, for example, a stored value that has been programmed into a storage cell. During a read operation, a sense amplifier is used to compare the current flow in a storage cell to the current flow in a reference cell.

Referring to FIG. 2A, an exemplary memory device includes a memory cell array 200 having reference cells 201 and storage cells 203 arranged into sectors 210. The memory array contains multiple sectors 210–220. The memory cells are generally non-volatile memory cells that may include floating gate transistors. The memory device may also contain a read circuit, a column decoder and a row decoder, at least one voltage source for programming and reading storage cells, sense circuitry, and other supportive circuits (not shown).

The memory cell array 200 is segmented or arranged into individual elements of the multiple sectors 210–220 or groups of memory cells. In the exemplary embodiment, each of the multiple sectors 210–220 contains multiple columns of storage cells 203 having a predetermined width such as a byte (8 storage cells), or word (16 storage cells, 32 storage cells, etc.). Each of the multiple sectors 210–220 also contains reference cells 201 associated with a group of storage cells 203. The reference cells 201 are also logically or physically arranged as columns so they are adjacent to or proximate to the columns of storage cells 203. Referring to FIG. 2B, in an alternate arrangement, a sector of storage cells 230–240 includes multiple columns of storage cells 205 and multiple columns of reference cells 207 arranged on both sides of the columns of storage cells 205. This arrangement of a memory cell array 202 may contain a higher percentage, density, or number of reference cells 207 in comparison to the prior art. The proximity or adjacent arrangement of the reference cells 207 to the storage cells 205 reduces operational variances associated with different physical locations, different structures (due to manufacturing variances), and different bias voltages on the storage cell sensing gate during a read operation.

Referring to FIG. 3, an exemplary row of memory cells 301 from an exemplary EEPROM sector such as the sector illustrated in FIG. 2B, includes a first reference cell 304, a group of multiple (eight) storage cells 306, and a second reference cell 307. Alternatively, equivalent embodiments may be developed for flash or other types of non-volatile memory. Each memory cell 304, 306, 307 includes a storage transistor (such as a memory transistor 310 for the second reference cell 307) and a selection device (such as a select transistor 311 for the reference cell 307). Each selection device is coupled to a word line 317, generally used to select or activate a row of memory cells. Alternate embodiments (not shown in FIG. 3) of the arrangement of reference cells include a single reference cell per group of multiple storage cells corresponding with FIG. 2A.

Another exemplary embodiment (not shown) includes multiple reference cells, or more than two reference cells per group of multiple storage cells. A plurality of bit line select devices 313 activate or select the group of multiple storage cells 306 and to activate or select the reference cells 304, 307 associated with the selected group of multiple storage cells 306. A variety of voltage levels may be used to program the storage cells 306 and the reference cells 304, 307 via the word line 317 and the bit lines 315.

Values stored in the multiple storage cells 306 and the reference cells 304, 307 correspond to a single or multi-bit digital value that a single memory cell can store. Each portion of the array containing the storage cells 306 has a set of associated reference cells 304, 307 to which reference values or data are written when data are written into the storage cells 306.

When data are written to the storage cells 306 in the memory device, a predetermined reference value is written or programmed into each corresponding reference cell 304, 307. The predetermined reference values may be different for each reference cell 304, 307. Also, when the storage cells in the memory device are erased or cleared, the predetermined reference values are written or programmed into each reference cell 304, 307. Optionally, when the corresponding storage cells 306 are erased or cleared, each reference cell 304, 306 may also be erased or cleared before the predetermined values are programmed in each reference cell 304, 306. In one embodiment, when there is a single reference cell associated with a byte of (eight) storage cells, each time the byte of storage cells is cleared (erased) or written (programmed), the reference cell is cleared (erased) and written to an "on" state having a low threshold voltage or storing a "0" value. In an alternative embodiment, when there are two reference cells associated with a byte of (eight) storage cells, each time the byte of storage cells is cleared (erased) or written (programmed), a first reference cell is written to an "off" state having a high threshold voltage or storing a "1" value and a second reference cell is written to an "on" state having a low threshold voltage or storing a "0" value.

After data values are written or programmed into the storage cells and reference cells (memory cells), a read circuit may select and read the stored value in the memory cells. In a read operation, the read circuit generates a digital value corresponding to a programmed threshold voltage of the memory cell. The read circuit may contain a ramp circuit that generates and applies a read signal to a control gate of a selected memory cell. The read circuit may also apply a voltage that moves across a voltage range of threshold voltages for a selected memory cell.

Generally, a sense amplifier compares the conductivity of a selected storage cell to the conductivity of a reference cell. A sense amplifier compares the storage cell drain current to a reference cell to determine if there is more or less current flowing though the storage cell (drain current). By comparing the characteristics of the selected storage cell to a reference cell, the threshold voltage and thus the stored logic value in the selected storage cell may be determined. Alternatively, the stored value of more than one reference cell may be combined or averaged with another reference cell to provide single or multiple reference levels. Any of the derived multiple levels may be used as a comparison with a selected storage cell. By comparing the stored level in a storage cell with a reference level, a logic value that has been stored in the storage cell may be determined.

In one embodiment, in association with a group of storage cells, a single reference cell is typically neither cleared to an "off" (1 or high threshold voltage) state nor written to an "on" (0 or low threshold voltage) state. The single reference cell may be cleared or erased, and then written or programmed to an intermediate value or state. The reference cell is generally manufactured or programmed such that an intermediate threshold voltage between an "off" state and an "on" state is stored in the reference cell. A single bit data value read from a storage cell is either greater than or less than (not equal to) the programmed state of the reference cell. By comparing the stored value of a storage cell to a reference cell, a sense amplifier will treat a storage cell having an "on" state as a data "0" and the sense amplifier will treat a storage cell having an "off" state as a data "1." For example, if a selected storage cell has more current than a reference current, the storage cell is storing a "0" logic value, and if the selected storage cell has less current than a reference current, the storage cell is storing a "1" logic value.

With further reference to FIG. 3, in another embodiment, the first and second reference cells 304, 307 are associated with the group of storage cells 306. When the stored values in the storage cells 306 are read, a read voltage is applied to the control gate line 314 of the storage cells 306. The drain current for a selected storage cell (one storage cell within the storage cell group 306) is monitored. The current flow in a selected storage cell and the current flow in a reference cell 304, 307 are proportional to the programmed threshold voltage in each cell. Each storage cell is then selectively coupled to a multiplexer 316 or other selection device. The multiplexer 316 output is coupled to a current to voltage converter 321.

The current to voltage converter 321 converts the drain current value from a selected storage cell to a voltage value. A voltage output on output line 358 of the current to voltage converter 321 is coupled to a first input of a sense amplifier 332, or comparator. The sense amplifier 332 compares the voltage value of the selected storage cell to a reference value. In this embodiment, the selection circuit is configured to select associated reference cells 304, 307 at the same time as the group of storage cells 306 is selected. The reference cells 304, 307 and the storage cells 306 share the same word line 317, gate line 314, and bit line select 313 devices. A bitline of the first reference cell 304 is coupled to a second current to voltage converter 323. The current to voltage converter 323 output 343 voltage level is proportional to the drain current or current flow in the first reference cell 304. Also, a bit line of the second reference cell 307 is coupled to another current to voltage converter 322. The current to voltage converter 322 output 342 voltage level is also proportional to the drain current or current flow in the second reference cell 307.

The voltage outputs of the reference cells 304, 307 current to voltage converters 322, 323 are coupled to buffer amplifiers 353, 354. The buffer amplifiers 353, 354 are coupled to a resistor network 355. The resistor network 355 in this embodiment averages the reference cell voltages, to provide a voltage reference output 357 having a voltage between an "on" reference voltage and an "off" reference voltage. The resistor network 355 is comprised of two similar resistors. The voltage output from the resistor network 355 is equivalent to (Vref_off−Vref_on)*½. In alternate embodiments, for example to accommodate multiple-bit storage cells, the resistor network may include more resistive elements or a ladder network to provide multiple voltage levels between the voltage levels derived from the first and second reference cells 304, 307. Each of the multiple voltages may be coupled to multiple buffer amplifiers (not shown) or may be coupled to a multiplexer or selection means similar to the storage cell multiplier 316 to select a voltage derived by the resistor network 355 to the input of a single buffer amplifier. The output voltage from the resistor network 355 is coupled to another (reference) buffer amplifier 356.

The reference output 357 from the reference buffer amplifier 356 is coupled to a second input of the sense amplifier 332 or comparator. The result of the read operation, or the sense amplifier 332 output 359, is issued from the comparison of the reference output 357 to the voltage derived by the current to voltage converter 321 voltage output on output line 358 associated with a selected storage cell (from the group of storage cells 306). In this embodiment, the multiplexer 316 serially selects each storage cell so that the storage cells 306 are serially and individually read, for example from storage cell 0 to 7. Since the reference output 357 voltage applied to the sense amplifier 332 is between a corresponding "off" state and a corresponding "on" state, the voltage output on output line 358 associated with a selected storage cell (programmed to an "off" or "on" state) will be higher or lower than a voltage on the the reference output 357. The sense amplifier 332 output 359 will therefore indicate the data value from the selected storage cell. The output of the sense amplifier may be coupled to a data encoder (not shown) to derive a stored logical data value.

In alternate embodiments, the memory interface may be implemented as a parallel instead of serial interface. In a specific embodiment, the current to voltage converters 323, 322, for the reference cells 304, 307, are coupled to the buffer amplifiers 353, 354. The buffer amplifiers 353, 354 are coupled to the resistor network 355. The resistor network is coupled to the (reference) buffer amplifier, and the output of the reference buffer amplifier (reference output 357) is used as a reference for multiple, parallel sense amplifiers (not shown). In this specific (parallel) embodiment, multiplexer 316 is not used. The outputs of each memory cell (0–7) 306 are each coupled to a corresponding current to voltage converter (not shown). Each current to voltage converter is similar to the single current to voltage converter 321, and coupled through the bit line select devices 313. Each current to voltage converter associated with each memory cell (0–7) 306 is correspondingly coupled to a sense amplifier (not shown). These sense amplifiers are similar to the single sense amplifier 332 so that each memory cell is coupled to a corresponding current to voltage converter and sense amplifier circuit. Each sense amplifier is coupled to the reference output 357, and the output of each sense amplifier corresponds to individual data values from the entire word stored in the memory cells (0–7) 306.

The described embodiments of the reference cell circuit, and the arrangement or configuration of the storage cells and reference cells will reduce the effect of process or operational variations within an EEPROM or flash memory device. Improvements include: a) the reference cell(s) is adjacent to the associated storage cell byte or storage cell word, b) the reference cell(s) have the same structure as the other storage cells, c) the reference cell sensing gates and the storage cell sensing gates are biased by the same reference voltage during a read operation, d) the reference cell(s) and the storage cells in the same byte or word are cleared (erased) and written (or programmed) by the same voltage or charge pump and the same voltage conditions are present during a write or program operation, and e) the reference cell(s) and the associated storage cells will experience the same number of write cycles and thus have the same degree of degradation history. The above circuit and memory cell arrangement provide a very close match between any reference cells and associated storage cells. The chance of having a read failure due to reference cell and storage cell mismatch and process variations is greatly reduced.

Figure 4:
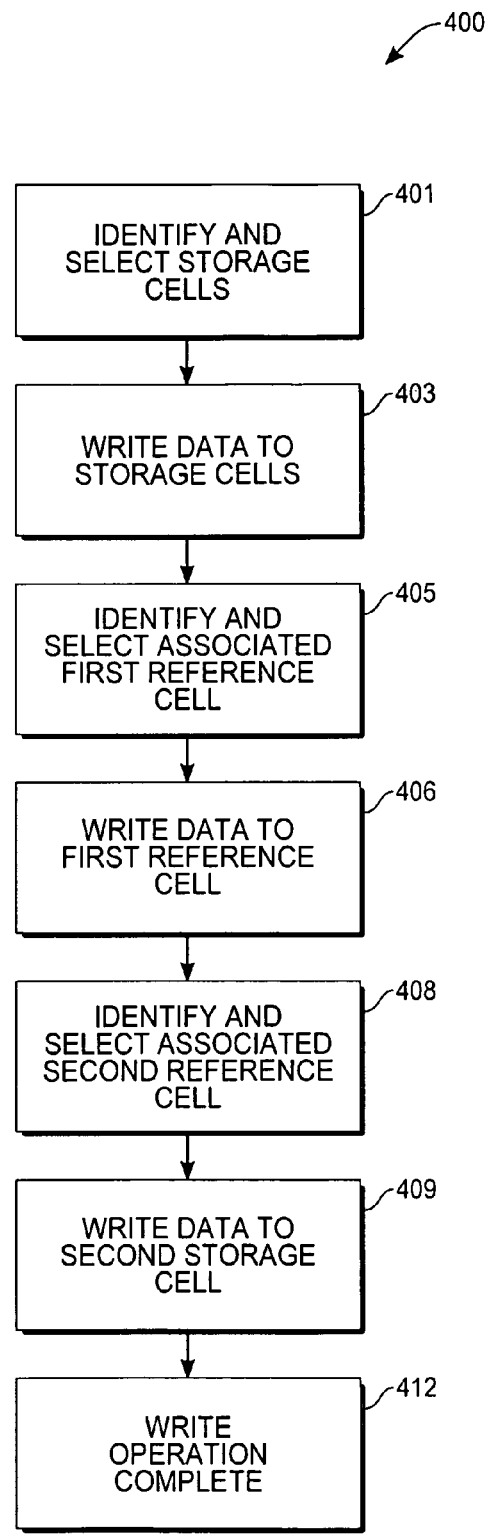
FIG. 4 is a process flow diagram of a storage cell and reference cell programming operation of the circuit of FIG. 3.

Referring to FIG. 4, when a group of storage cells are identified and selected 401, and data values are written 403 to each storage cell within the group of storage cells, first and second reference cells will have a corresponding first and second predetermined data value written to them. The storage cells are generally identified by address circuits in the memory device, which activate selection devices in the memory device to select the storage cells. A first reference cell is identified and selected 405, and a first predetermined data value is written 406 to the first reference cell. In one embodiment, the first predetermined data value written to the first reference cell may be, for example, a binary data "1" value. Alternatively, a maximum value may be written such as a binary "11" data value. Optionally, other data values or states may be written to the first reference cell. A second reference cell is identified and selected 408, and a second predetermined data value is written 409 to the second reference cell. After all associated reference cells have been programmed, written to, or refreshed, the write operation is completed 412. In one embodiment, the second predetermined data value written to the second reference cell is, for example, a binary data "0" value. Optionally, other data values or states may be written to the second reference cell.

Programming each reference cell when an associated byte of storage cells are programmed reduces operational variances between the storage cells and reference cells. A different number of write cycles applied to the reference and storage cells may produce different erase, write, or programming characteristics and a different degree of degradation to each of the cells. Normally, values read from a storage cell may drift from one reading to the next because of variations in the operating parameters of an individual storage cell or reference cell. However, when a reference cell is programmed whenever an adjacent or proximate storage cell is programmed, the operating characteristics effected by the number of program cycles for reference cells and storage cells will be matched.

The reference cells and storage cells are written at approximately the same time and read at approximately the same time. The reference cells' performance or variances thus tracks the performance or variances of the storage cells. The output data value from a sense amplifier and/or data encoder is correct and reliable, even though various reference and storage cells throughout the memory array may vary depending upon the degradation history or location of the particular memory cell within the memory array.

Presented in this invention is a memory array containing reference cells associated with a group of storage cells. The reference cells are logically or physically arranged as columns adjacent to or proximate to the columns of storage cells. The reference cells are programmed to predetermined values when the storage cells are programmed. The reference values used to determine the stored value in a storage cell may be derived from the values stored in the reference cells. During a read operation, the values stored in the reference cells may be multiplexed or averaged. The proximity or adjacent arrangement of the reference cells to the storage cells reduces operational variances associated with different physical locations, different structures (due to manufacturing variances), and different bias voltages on the storage cell sensing gate during a read operation.

Those of skill in the art will recognize that the invention can be practiced with modification and alteration within the spirit and scope of the appended claims and many other embodiments will be apparent to those of skill in the art upon reading and understanding the description presented herein. For example, although the embodiments describe a single reference value derived from values stored in two reference cells, multiple reference values may be derived from the stored values in the two reference cells for a multiple-bit storage cell. The description provided herein is thus to be read in an illustrative rather than limiting sense.

What is claimed is:

1. A memory device comprising:
   an array of memory cells including at least one reference cell associated with a group of storage cells, the array of memory cells fabricated so that the at least one reference cell is proximate to and in the same row as the group of storage cells in the array; and
   a write circuit coupled to the memory cell array, the write circuit being configured to operate on the at least one reference cell and the group of storage cells at a substantially concurrent timeframe.

2. The memory device of claim 1, wherein the at least one reference cell has a structure similar the group of storage cells.

3. The memory device of claim 1, wherein the at least one reference cell is configured to be biased by a voltage source that biases the group of storage cells.

4. The memory device of claim 1, wherein each time the group of storage cells is programmed, the at least one reference cell is programmed to a predetermined value.

5. The memory device of claim 4, wherein the predetermined data value is a data value of zero or a minimum data value.

6. The memory device of claim 4, wherein the predetermined data value is a data value of one or a maximum data value.

7. The memory device of claim 1, wherein the group of storage cells is a byte of storage cells arranged as a row of eight storage cells.

8. The memory device of claim 1, wherein the group of storage cells is a word of storage cells arranged as a row.

9. The memory device of claim 1, wherein each memory cell in the array further comprises a floating gate.

10. The memory device of claim 1, wherein each memory cell in the array is capable of storing multiple bits of data.

11. A non-volatile memory device comprising:
    an array of memory cells including a plurality of reference cell, associated with a group of storage cells, the array of memory cells configured so that a first reference cell and second a reference cell are adjacent to and in the same row as the group of storage cells in the array; and a write circuit coupled to the memory cell array, the write circuit being configured to program the first adjacent reference cell to a first predetermined value and being configured to program the second adjacent reference cell to a second predetermined value at a substantially concurrent timeframe as programming the group of storage cells.

12. The memory device of claim 11, wherein the first and second reference cells have the same structure as the adjacent group of storage cells.

13. The memory device of claim 11, wherein the first and second reference cells are configured to be biased by a voltage source that biases the adjacent group of storage cells.

14. The memory device of claim 11, wherein the first predetermined value corresponds to a stored data value of zero or a minimum data value.

15. The memory device of claim 11, wherein the second predetermined value corresponds to a stored data value of one or a maximum data value.

16. The memory device of claim 11, wherein the group of storage cells is configured as a row of eight storage cells.

17. The memory device of claim 11, wherein the group of storage cells is configured as a word of storage cells.

18. The memory device of claim 11, wherein the non-volatile memory cells are flash or EEPROM memory cells.

19. The memory device of claim 11, wherein each non-volatile memory cell in the array is capable of storing multiple bits of data.

20. A method for operating a memory device, the method comprising:

selecting a predetermined group of storage cells arranged in a row within in a memory array;

performing a programming operation on the predetermined group of storage cells;

selecting a corresponding reference cell adjacent to and the same row as the predetermined group of storage cells; and programming the corresponding reference cell to a predetermined value each time the corresponding predetermined group of storage cells is programmed.

21. The method of claim 20 wherein the reference cell is programmed to a predetermined maximum data value.

22. The method of claim 21 wherein programming the reference cell to a predetermined data value corresponds to a predetermined threshold voltage.

23. The method of claim 21 wherein programming the reference cell to a predetermined value corresponds to a multi-bit value programmed to a single memory cell.

24. The method of claim 20 wherein the steps of programming the storage cells and programming the reference cell are conducted sequentially.

25. A method for operating a non-volatile memory, the method comprising:

selecting a group of storage cells arranged in a row within a memory array;

performing a write operation on the group of storage cells;

selecting a first corresponding reference cell adjacent to and in the same row as the predetermined group of storage cells;

programming the first reference cell to a first predetermined value at a substantially concurrent timeframe as a write operation performed on the corresponding group of adjacent storage cells;

selecting a second corresponding reference cell adjacent to and in the same row as the predetermined group of adjacent storage cells; and programming the second reference cell to a second predetermined value at a substantially concurrent timeframe as a write operation performed on the corresponding group of adjacent storage cells.

26. The method of claim 25 wherein the first reference cell is programmed to a predetermined minimum data value and the second reference cell is programmed to a predetermined maximum data value.

27. The method of claim 26 wherein programming each reference cell to a predetermined data value corresponds to a predetermined threshold voltage.

28. The method of claim 26 wherein a predetermined reference value corresponds to a multi-bit value programmed to a single memory cell.

29. The method of claim 25 wherein the steps of programming the storage cells and programming the first and second reference cells are conducted sequentially.

30. The method of claim 25 wherein during a read operation, a reference value is derived from the values stored in both the first and second reference cells.

* * * * *